United States Patent [19]
Lin

[11] Patent Number: 6,142,811
[45] Date of Patent: Nov. 7, 2000

[54] ELECTRICAL CONNECTOR

[75] Inventor: Nick Lin, Hsin-Chuang, Taiwan

[73] Assignee: Hon Hai Precision Ind. Co., Ltd., Taipei Hsien, Taiwan

[21] Appl. No.: 09/377,296

[22] Filed: Aug. 18, 1999

[30] Foreign Application Priority Data

Apr. 9, 1999 [CN] China ................................. 88205502

[51] Int. Cl.$^7$ ............................................. H01R 4/50
[52] U.S. Cl. ........................................ 439/342; 439/83
[58] Field of Search ............................. 439/83, 876, 342, 439/858, 861, 259

[56] References Cited

U.S. PATENT DOCUMENTS

| | | | |
|---|---|---|---|
| 5,044,973 | 9/1991 | Noda et al. | 439/342 |
| 5,092,789 | 3/1992 | Sinclair | 439/342 |
| 5,535,513 | 7/1996 | Frantz | 439/83 |
| 5,658,160 | 8/1997 | Lai | 439/342 |
| 5,746,608 | 5/1998 | Taylor | 439/83 |
| 5,797,774 | 8/1998 | Kaneko | 439/342 |

*Primary Examiner*—Gary F. Paumen
*Attorney, Agent, or Firm*—Wei Te Chung

[57] ABSTRACT

An electrical connector comprises a dielectric base defining a number of contact receiving holes, a slidable cover fixed to the base and defining a number of pin receiving slots for receiving corresponding pins of an IC package therein, and a number of contacts received in the corresponding contact receiving slots of the base. Each contact comprises a main body for supporting the contact, a contact portion comprising contact tabs extending from the main body for electrically contacting the corresponding pin of the IC package, a guiding portion extending from the contact tabs for guiding the corresponding pin of the IC package to properly engage with the contact tabs, and a soldering portion extending from the main body for being surface mounted to a circuit board. The soldering portion of each contact comprises a pad adapted for being surface mounted to the circuit board, and a shoulder extending from and projecting above the plane of the pad for preventing molten solder from wicking upwards. A neck is formed between the main body and the soldering portion for providing the soldering portion with proper resiliency relative to the main body. A pair of cutouts is defined in the main body of the contact at opposite sides of the neck and proximate the shoulder for receiving molten solder therein and for preventing the molten solder from further wicking upwards.

4 Claims, 11 Drawing Sheets

ELECTRICAL CONNECTOR

BACKGROUND OF THE INVENTION

The present invention relates to an electrical connector, and particularly to a zero insertion force (ZIF) connector having contacts which prevent molten solder from upwardly wicking along the contacts thereby achieving improved signal transmission.

Figure 1A:
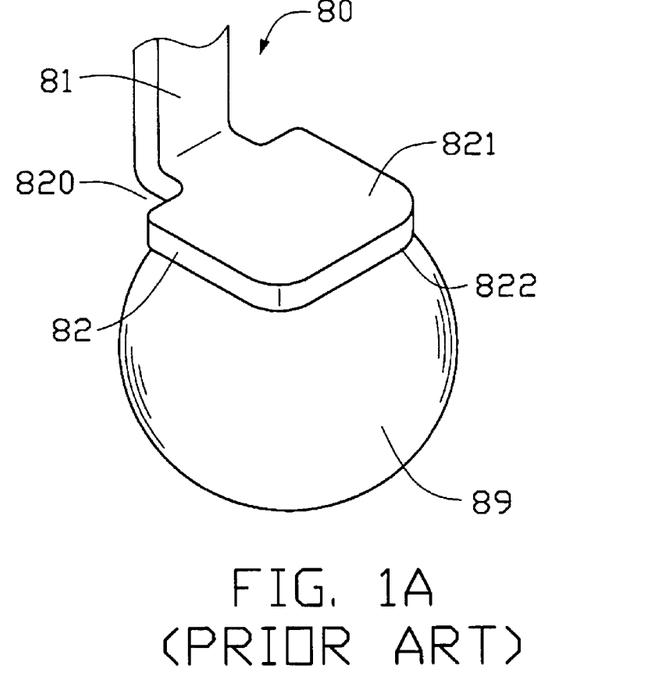
FIG. 1A is a perspective view of a conventional contact with a solder ball attached thereto.
Figure 1B:
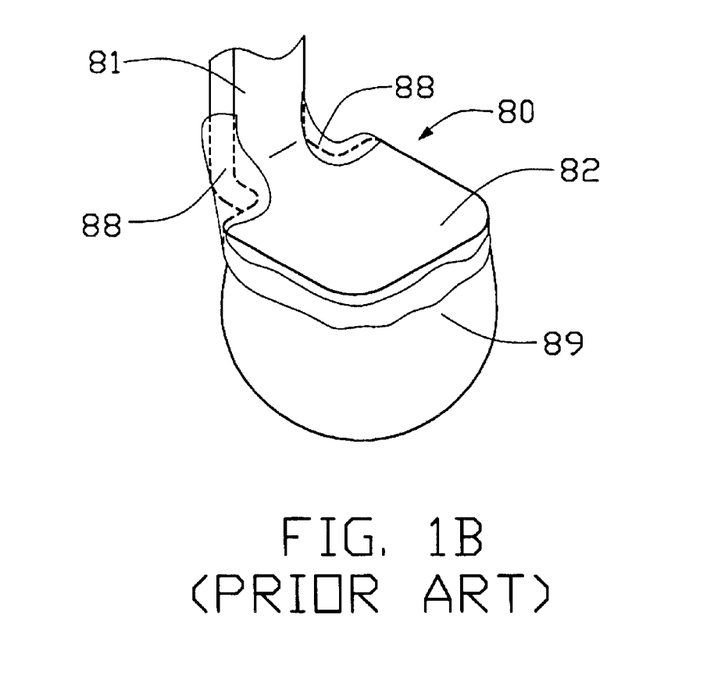
FIG. 1B is similar to FIG. 1A showing molten solder upwardly wicking along the contact.

A pertinent conventional connector relating to the present invention is a ball grid array (BGA) type connector. Referring to FIGS. 1A and 1B, a leg 80 of a contact (not labeled) of a conventional BGA connector (not shown) with a solder ball 89 attached thereto is shown. The leg 80 comprises an elongate connection portion 81, and a pad 82 for being surface mounted to a circuit board (not shown). The connection portion 81 is integrally formed with the pad 82 and a pair of cutouts 820 is defined proximate a junction between the connection portion 81 and the pad 82 on opposite sides of the connection portion 81. The solder ball 89 is attached to a bottom surface 822 of the pad 82.

When the BGA connector is heated to be surface mounted to the circuit board, the solder ball 89 melts and wicks upward along the soldering portion 81 via the cutouts 820 of the contact. Molten solder 88 may wick along the soldering portion 81 toward a contact tabs of the contact thereby adversely affecting signal transmission.

Moreover, wicking of the molten solder 88 causes the solder ball 89 to become smaller. Thus, the solder balls 89 attached to corresponding contacts do not remain in a common plane thereby decreasing the effectiveness of a soldering connection between the connector and the circuit board.

Figure 2A:
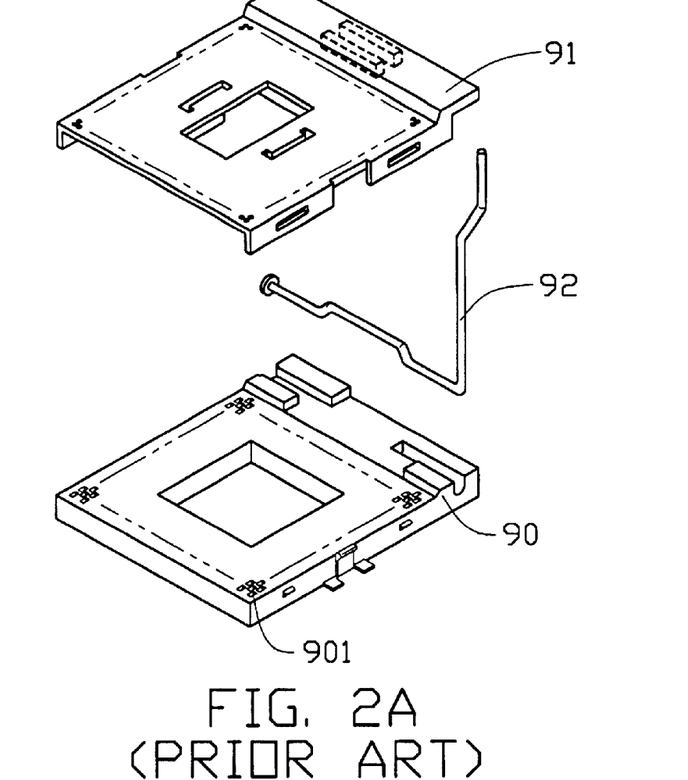
FIG. 2A is an exploded view of a conventional zero insertion force (ZIF) connector.
Figure 2B:
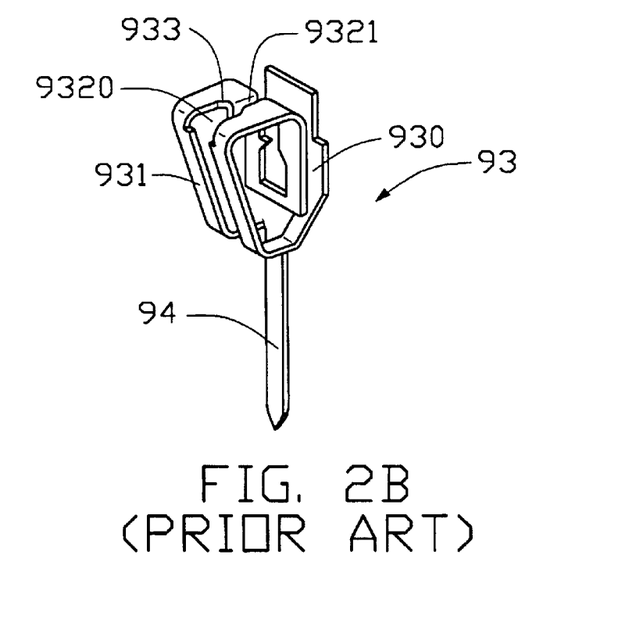
FIG. 2B is a perspective view of a contact of the conventional ZIF connector of FIG. 2A.

Another conventional connectors adapted for electrically connecting an IC package with a circuit board are disclosed in Taiwan Patent Application Nos. 83214436 and 86302100. Referring to FIGS. 2A and 2B, a conventional ZIF connector comprises a dielectric base 90, a slidable cover 91 fixed to the base, a cam lever 92 attached between aligned side edges of the base 90 and the cover 91 for driving the cover 91 to slide along a top surface of the base 90, and a plurality of contacts 93 received in corresponding contact receiving passageways 901 defined in the base 90.

Each contact 93 comprises a base plate 930, a curved portion 931 extending from a lower edge of the base plate 930, and a connecting leg 94 downwardly extending from the base plate 930 for electrically connecting with a circuit board (not shown). The curved portion 931 has a pair of curved arms (not labeled) separated from each other at the lower edge of the base plate 930 and connecting with each other at free ends thereof. The curved portion 931 defines a wide gap 9320 adjacent to a narrow gap 9321, and a pair of flanges 933 inwardly projecting from a junction between the wide gap 9320 and the narrow gap 9321. When the IC package (not shown) is positioned on the cover 91, pins of the IC package are disposed in the center of the wide entries 9320 of the corresponding contacts 93. With the sliding movement of the cover 91 driven by the cam lever 92 along the top surface of the base 90, the pins will be driven to move from the wide gaps 9320 into the narrow gaps 9321 guided by the flanges 933. Thus, the pins of the IC package electrically contact the corresponding contacts 93 of the ZIF connector.

However, when the contacts 93 are soldered to a circuit board (not shown), molten solder is apt to upwardly wick along the connecting legs 94 of the contacts 93 thereby adversely affecting signal transmission.

Furthermore, the symmetrical design of the conventional contact 93 usually provides a pair of symmetrical guiding portions such as the curved arms of the contact 93 to contact the corresponding pin of the IC package. Thus, frictional forces exerted on the pins are simultaneously applied by both the symmetrical curved arms thereby greatly increasing resistance which hinders proper positioning of the pins. The greatly increased resistance may wear a metal plating coat on the pins and the contacts thereby resulting in poor signal transmission.

In addition, the pins of the IC package may not be properly disposed in the corresponding pin receiving passageways of the cover 91, so that the pins will not be positioned in the center of the corresponding wide gaps 9320. Thus, when the pins are driven to move from the wide gaps 9320 into the narrow gaps 9321, a pin may only contact a single curved arm whereby the single curved arm may be burdened with too large a force, which may break the single arm, resulting in poor electrical connection.

BRIEF SUMMARY OF THE INVENTION

A main object of the present invention is to provide an electrical connector having contacts which prevent molten solder from upwardly wicking thereby ensuring reliable signal transmission.

Another object of the present invention is to provide an electrical connector for establishing electrical connection between an IC package and a circuit board, the connector having contacts which reduce frictional resistance exerted on pins of the IC package when the pins of the IC package are driven to contact the corresponding contacts of the connector.

Another object of the present invention is to provide an electrical connector comprising contacts having auto-adjustment capabilities for preventing misalignment of the contacts due to different thermal expansions between the connector and a circuit board, to which the connector is fixed, resulting from different coefficients of thermal expansion of the connector and the circuit board.

An electrical connector in accordance with the present invention comprises a dielectric base defining a plurality of contact receiving slots therein, a slidable dielectric cover fixed to the base for connecting an IC package with the connector, and a plurality of contacts received in the corresponding contact receiving slots for electrically connecting pins of the IC package with a circuit board.

Each contact comprises a U-shaped non-symmetrical guiding portion for guiding a corresponding pin of the IC package to electrically connect with the contact, a pair of contact tabs extending from opposite ends of the guiding portion and defining a narrow gap therebetween for receiving the corresponding pin of the IC package, a main body integrally formed with the guiding portion for supporting the contact, and a soldering portion extending from the main body for being surface mounted to a circuit board. A collar chamber is defined in the guiding portion in communication with the narrow gap for receiving the pin of the IC package.

The soldering portion comprises a neck extending from the main body, a pad, and a shoulder formed between the neck and the pad. The shoulder projects beyond the plane of the pad. A pair of cutouts is defined in the main body at opposite sides of the neck proximate the shoulder.

The guiding portion and the contact tabs are nonsymmetrically connected and include a stationary arm and a movable arm. The stationary arm is connected to the main body and has a linear stationary section, while the movable arm is cantilevered and movable relative to the stationary arm.

When a corresponding pin of the IC package is driven to move from the collar chamber of the guiding portion into the narrow gap between the contact tabs, the pin of the IC package slides along the stationary arm toward the contact tabs. When the pin approaches the contact tabs, the movable arm is deflected away by the pin relative to the stationary arm to allow the pin of the IC package to enter into the narrow gap, while the stationary arm remains stationary and is supported by a side wall of the corresponding contact receiving slot of the base. Thus, frictional resistance exerted on the pin of the IC package is greatly reduced compared to the conventional symmetrical designation as described above. Therefore, the pins of the IC package and the contacts in accordance with the present invention will not break due to a large resistance exerted on the pins of the IC package and a counter force exerted on the contacts.

Other objects, advantages and novel features of the invention will become more apparent from the following detailed description when taken in conjunction with the accompanying drawings.

DETAILED DESCRIPTION OF THE INVENTION

Figure 3:
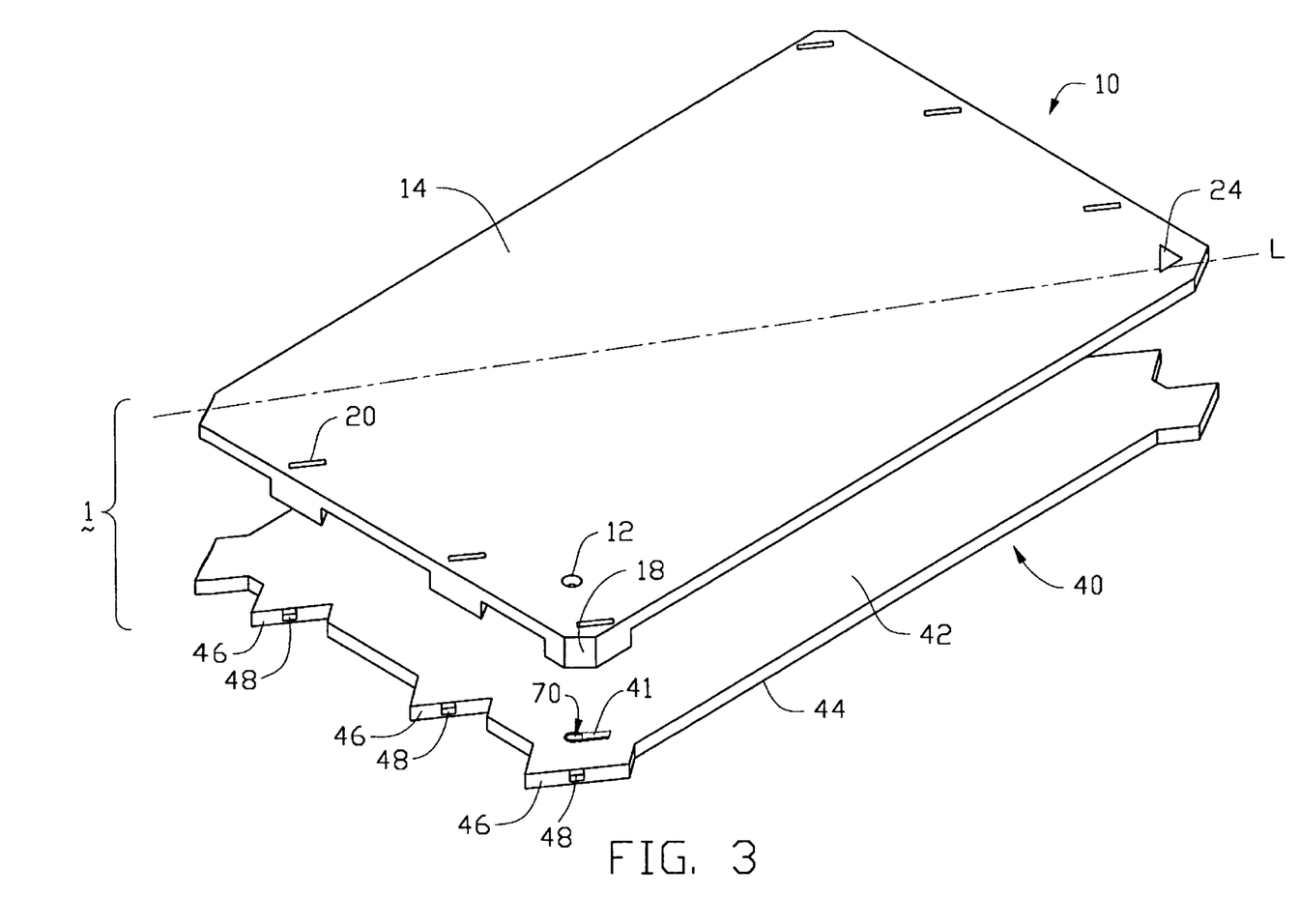
FIG. 3 is an exploded view of an electrical connector of the present invention.
Figure 4:
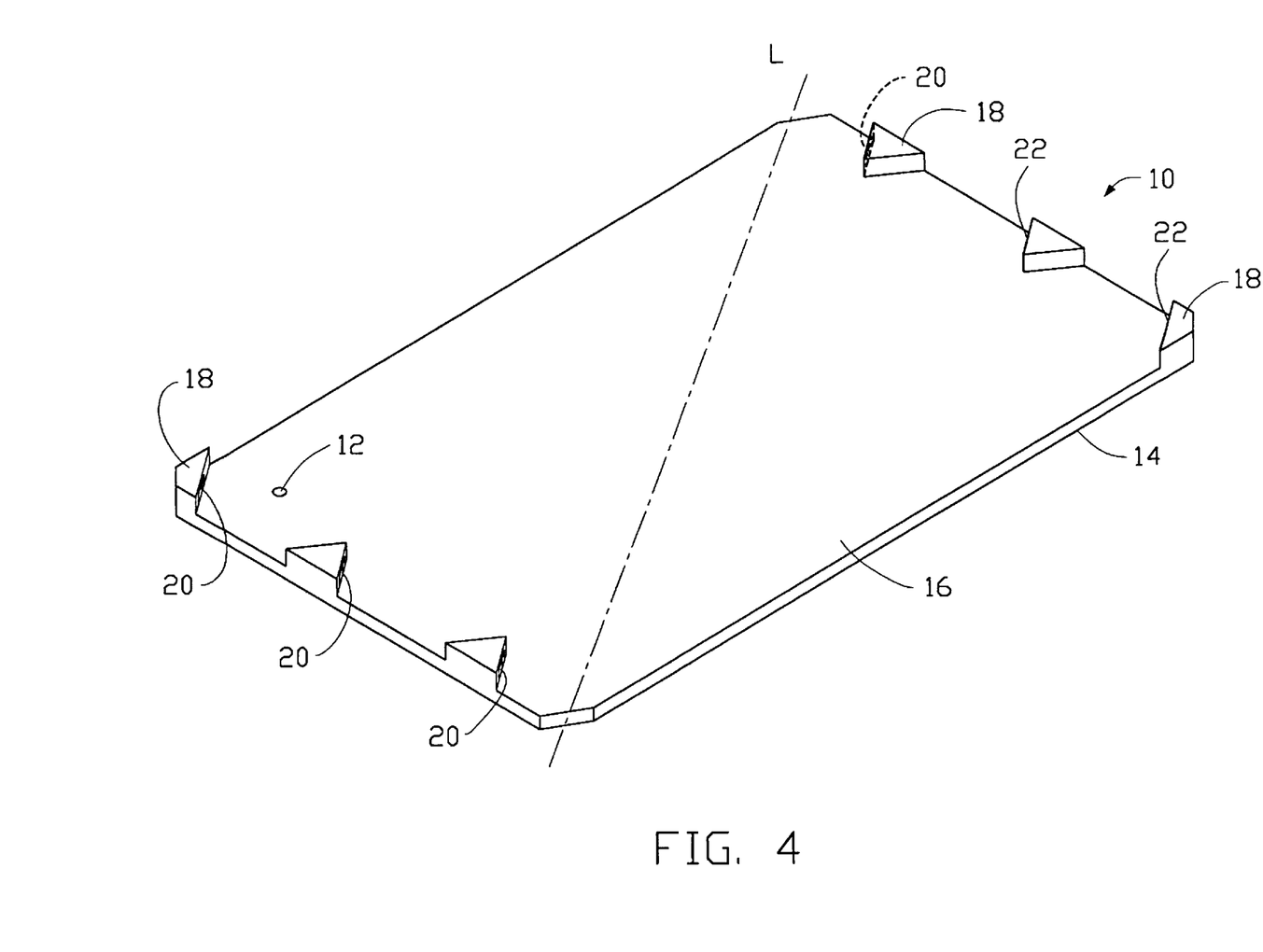
FIG. 4 is a perspective view of a cover of FIG. 3.
Figure 10:
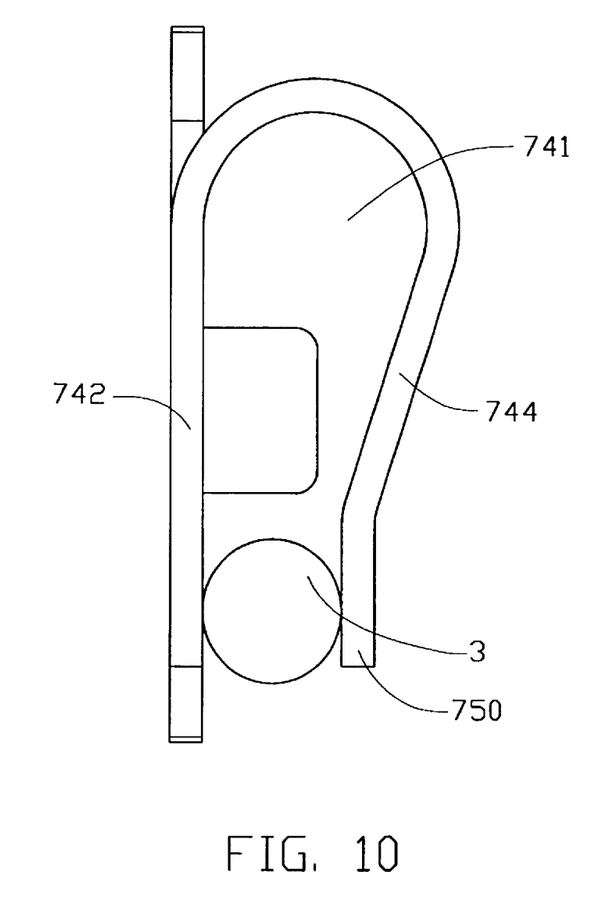
FIG. 10 is a top plan view showing the pin of the IC package engaged with the contact.

Referring to FIGS. 3 and 4, an electrical connector 1 in accordance with the present invention comprises a dielectric cover 10, a dielectric base 40 fixed to the cover 10, and a plurality of contacts 70 received in the base 40. The cover 10 defines a plurality of pin receiving holes 12 (only one shown) for receiving corresponding pins 3 (FIGS. 8 and 10) of an IC package (not shown) between a top face 14 and a bottom face 16. Three spaced blocks 18 are formed on the bottom face 16 proximate each lateral edge thereof. Each block 18 defines a passageway 20 between the top face 14 and a side surface 22 of the block 18. A label 24 is provided to indicate a diagonal direction L. The base 40 defines a plurality of contact receiving slots 41 between a top surface 42 and a bottom surface 44 for receiving the corresponding contacts 70 therein, and forms six spaced projections 46 corresponding to the blocks 18 of the cover 10. Each projection 46 forms a latching tab 48 on an edge thereof for engaging with the corresponding passageway 20 of the cover 10.

Figure 5:
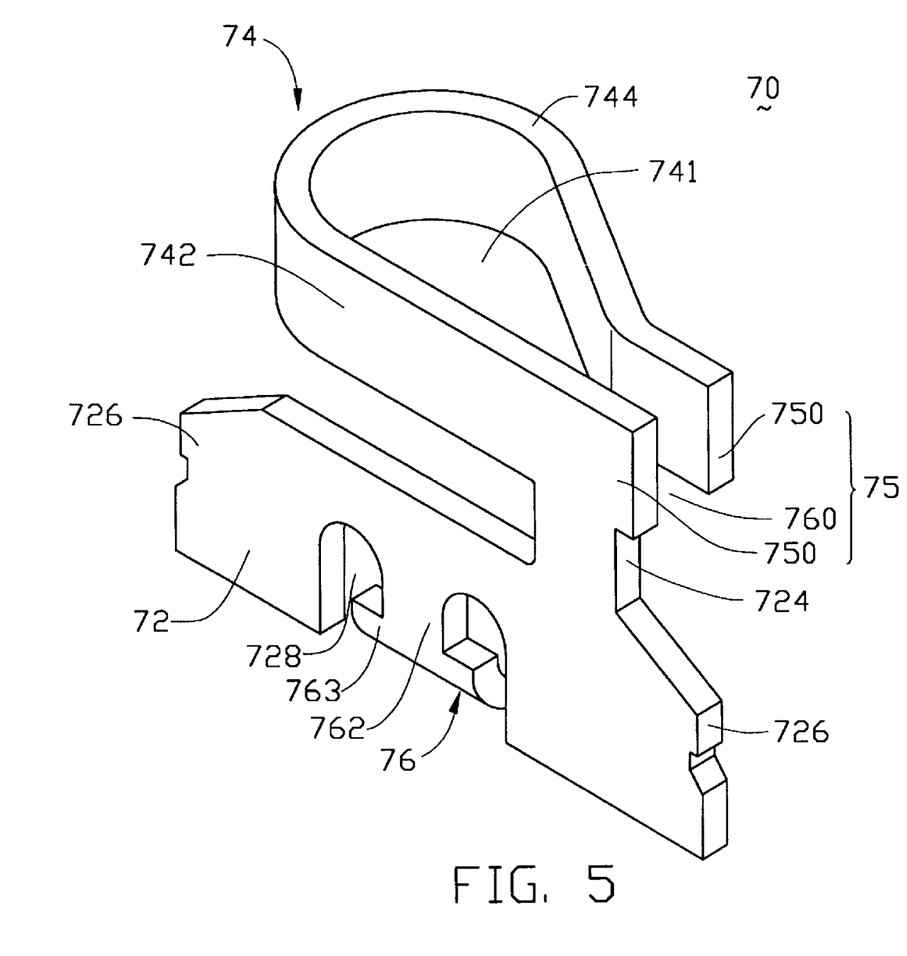
FIG. 5 is a perspective view of a contact in accordance with the present invention.
Figure 6:
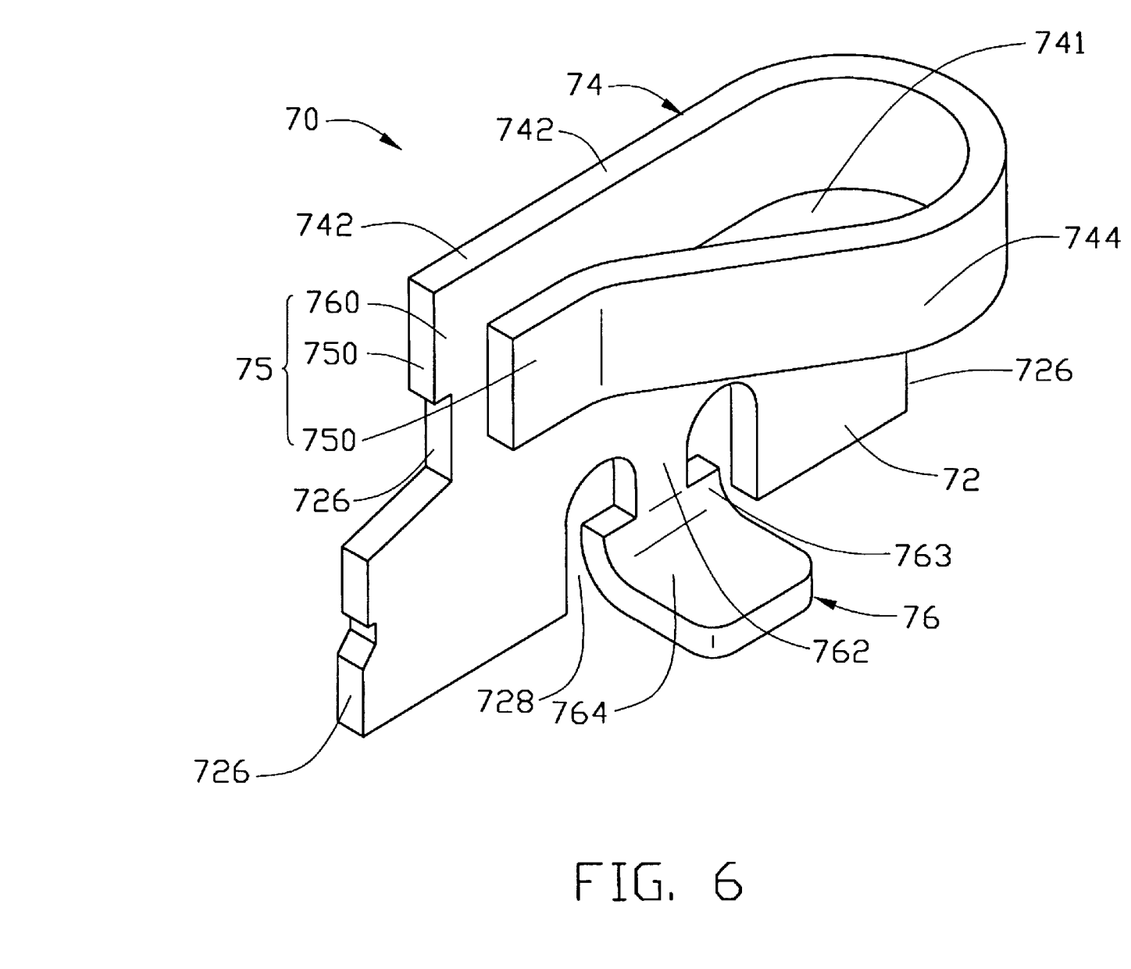
FIG. 6 is another perspective view of the contact.

Referring to FIGS. 5 and 6, each contact 70 comprises a main body 72 for supporting the contact 70, a U-shaped guiding portion 74 for guiding the corresponding pin 3 of the IC package to engage with the contact 70, a contact portion 75 extending from the main body 72, and a soldering portion 76 for being surface mounted to the circuit board. The contact portion 75 comprises a pair of contact tabs 750 extending from opposite ends of the guiding portion 74 and defining a gap 760 therebetween for reception of the corresponding pin 3 of the IC package whereby the pins 3 electrically engages with the contact tabs 750.

The guiding portion 74 and the contact tabs 750 of each contact 70 are connected with each other in the form of a non-symmetrical loop. The non-symmetrical loop includes a stationary arm 742 and a movable arm 744. The stationary arm 742 is connected to the main body 72, while the movable arm 744 is cantilevered and movable relative to the stationary arm 742. A collar chamber 741 is defined between the stationary arm 742 and the movable arm 744.

The main body 72 is elongate and is connected with the stationary arm 742 via a narrow second neck 724. The narrow second neck 724 provides the stationary arm 742 with proper resiliency relative to the main body 72. The main body 72 forms barbs 726 on opposite lateral edges thereof. The barbs 726 interferentially engage with inner surfaces of the corresponding contact slot 41 of the base 40 thereby securely fixing the contacts 70 within the base 40.

The soldering portion 76 is connected with the main body 72 via a narrow first neck 762 and perpendicularly extends from the first neck 762 for being surface mounted onto the circuit board. The narrow first neck 762 provides the soldering portion 76 with proper resiliency relative to the main body 72. Moreover, the first neck 762 does not extend beyond the main body 72 for reducing a height of the contact 70 thereby promoting miniaturization of the connector. A pair of cutouts 728 is defined in the main body 72 at opposite sides of the first neck 762 for further providing the soldering portion 76 with proper resiliency. Therefore, if different thermal expansions of the connector 1 and the circuit board occur due to different coefficients of thermal expansion (CTE) when the connector is surface mounted to the circuit board, the first and second necks 762, 724 allow appropriate deformation resulting from different forces exerted by the connector and the circuit board, respectively. Thus, misalignment of the contacts 70 caused by the different CTE of the connector and the circuit board is avoided thereby ensuring reliable signal transmission.

Figure 11:
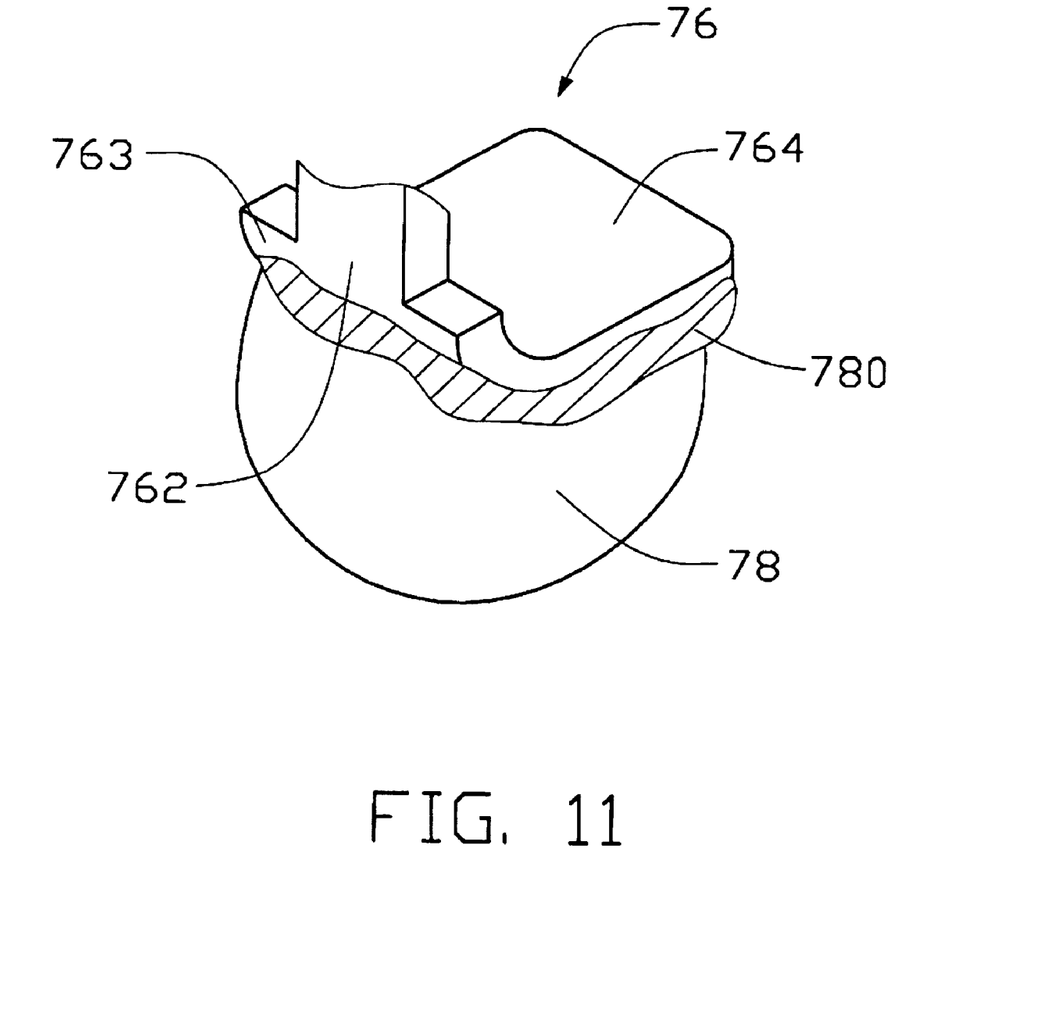
FIG. 11 is a partial perspective view showing the contact with a solder ball attached thereto.

The soldering portion 76 comprises a pad 764 for being surface mounted to the circuit board, and a shoulder 763 formed between the pad 764 and the first neck 762. The shoulder 763 is curved and projects above the horizontal plane of the pad 764 and the cutouts 728 are provided on opposite sides of the shoulder 763. Thus, referring also to FIG. 1, when the connector 1 is heated to be surface mounted to the circuit board, a solder ball 78 pre-attached to a bottom surface of the pad 764 will melt. The molten solder 780 will creep along the bottom surface of the pad 764 and move upwards along an outer surface of the shoulder 763. Due to the curved shoulder 763, the molten solder 780 will generally not wick up the second neck 762. Even if the molten solder 780 continues to move up the first neck 762, the cutouts 728 will receive the molten solder 780 and prevent the molten solder 780 from wicking further upwards.

Figure 7:
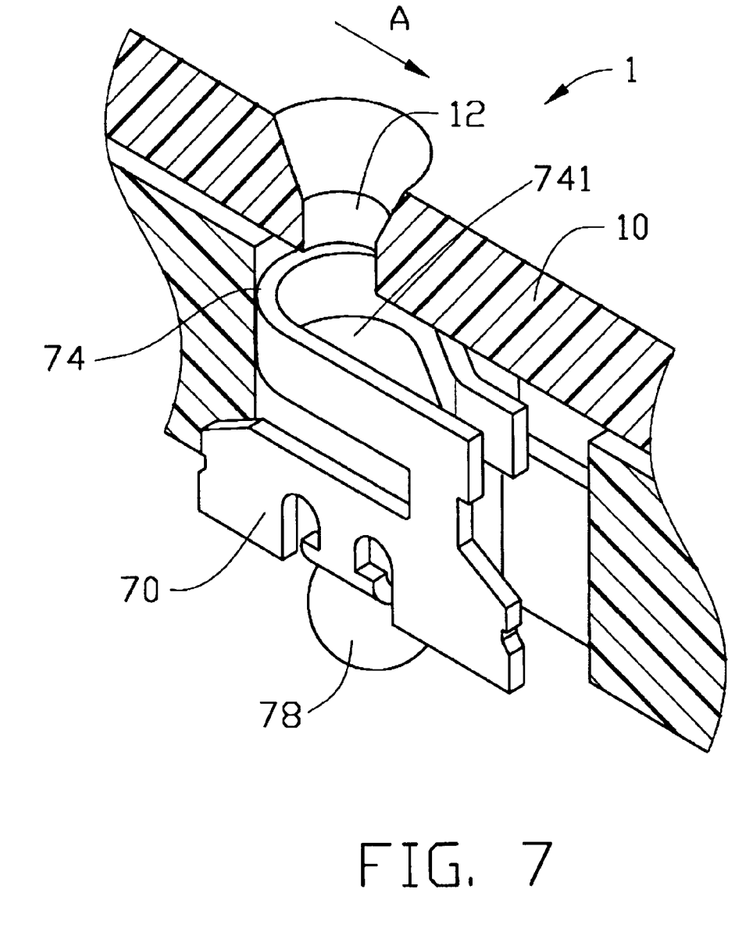
FIG. 7 is a cut-away view showing the contact fixed in a base of FIG. 3 before the cover is driven along the base.
Figure 8:
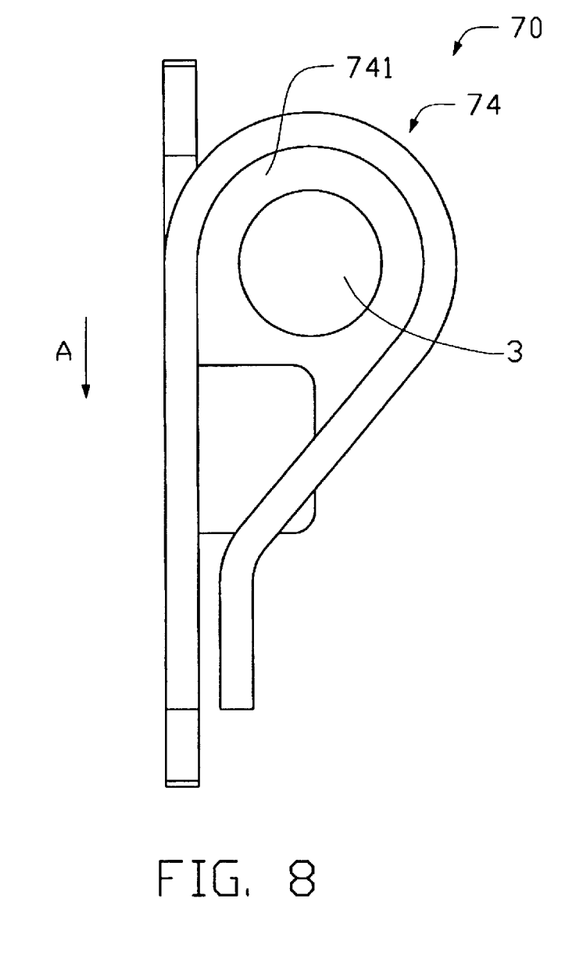
FIG. 8 is a top plan view showing a pin of an IC package initially inserted in the contact.
Figure 9:
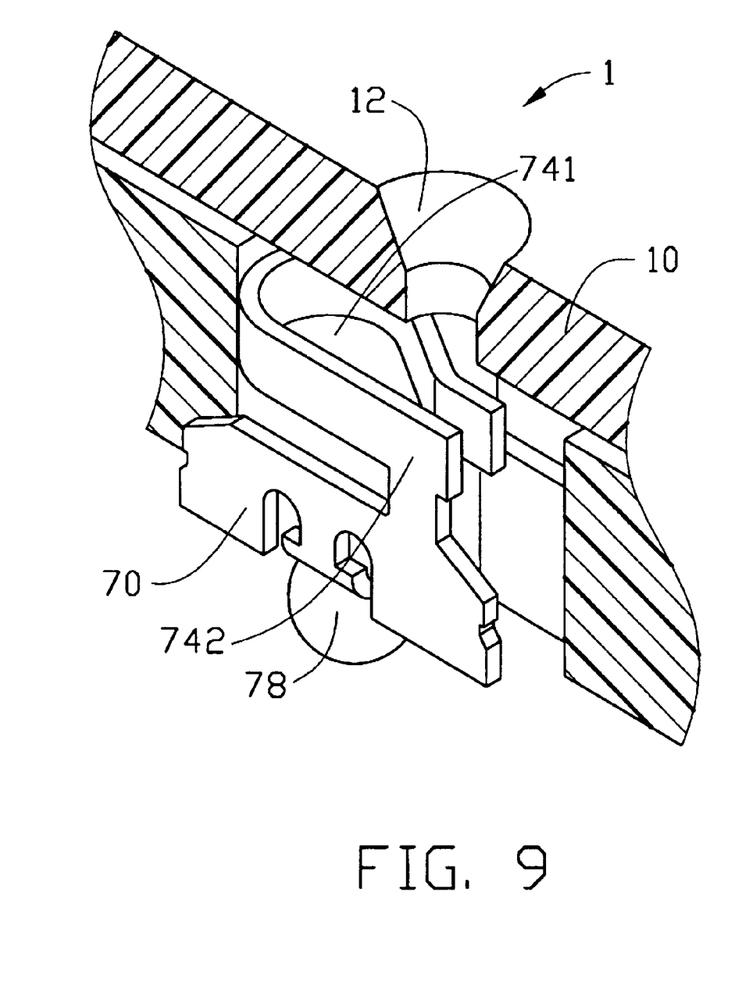
FIG. 9 is a cross-sectional view showing the contact fixed in the base after the cover is driven along the base.

Referring further to FIGS. 7, 8 and 9, in assembly, the contacts 70 are deposited in the corresponding contact receiving slots 41 of the base 40. The cover 10 is then fixed to the base 40 with the bottom face 16 of the cover 10 abutting against the top surface 42 of the base 40. The latching blocks 18 of the cover 10 engage with the corresponding projections 46 of the base 40. The latching tabs 48 of the base 40 interferentially fit within the corresponding passageways 20 of the cover 10. Thus, assembly of the connector of the present invention is complete.

The IC package is then disposed on the top face 14 of the cover 10 and the pins 3 extend into the corresponding pin receiving slots 12. An exterior tool is provided to drive the cover 10 to slide along the top surface 42 of the base 40 in the diagonal direction L indicated by the label 24, while the pins 3 of the IC package are simultaneously driven to move in a direction "A" indicated in FIGS. 7 and 8. Thus, the pins 3 engage with the corresponding contacts 70 of the connector 1. The solder balls 78 are then attached to bottom surfaces of the pads 764 of the corresponding contacts 70. The connector 1 along with the IC package and the solder balls 78 is then surface mounted to the circuit board.

Before the cover 10 is driven to move, the pin receiving holes 12 of the cover 10 align with and each pin 3 simultaneously extends into the collar chamber 741 of the corresponding contacts 70 received in the corresponding contact receiving slots 41 of the base 40. The pins 3 are intended to be positioned in the collar chambers 741 of the corresponding contacts 70 and to exactly align with the gap 760. When the cover 10 is driven to slide, the pins 3 are also driven to move from the collar chambers 741 toward the gaps 760 between the contact pads 750. Each pin 3 is driven to abut against the stationary arm 742 and the movable arm 744. A pin 3 may be positioned not exactly aligning with the corresponding gap 760 thereby producing a clearance between the pin 3 and the gap 740. In such a case, the pin 3 will also be laterally guided into the corresponding gap 760 by the guiding portion 74 while the movable arm 744 is simultaneously being laterally deflected. Since the stationary arm 742 is supported by the side wall of the corresponding contact receiving slot 41 of the base 40, the stationary arm 742 does not move while the movable arm 744 is being deflected away from the stationary arm 742. Each pin 3 is then driven to move from the collar chamber 741 into the gap 760 between the contact tabs 75.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically interconnecting an IC package and a circuit board, comprising:

a dielectric base defining a plurality of contact receiving slots therein;

a dielectric cover being slidably attached to the dielectric base and comprising a plurality of pin receiving holes aligned with the corresponding contact receiving slots for insertion of pins of the IC package; and a plurality of contacts received in the contact receiving slots, each contact comprising a main body secured within a corresponding receiving slot, a contact portion extending from the main body for electrically contacting a corresponding pin of the IC package, a first neck outwardly extending from the main body, and a soldering portion perpendicularly extending from the first neck;

wherein a pair of cutouts is defined on opposite sides of the first neck in the main body whereby the first neck provides the soldering portion with resiliency relative to the main body, the soldering portion comprising a planar pad and a shoulder formed between the planar pad and the first neck, the shoulder upwardly extending beyond a plane of the planar pad for preventing molten solder attached under the planar pad from wicking upward along the first neck, the cutouts being adjacent to the shoulder for receiving molten solder wicked upward along the first neck and for preventing molten solder from further wicking upward;

wherein the contact portion comprises two opposing contact tabs, a U-shaped guiding portion extends from and connects between each contact tab for guiding the corresponding pin of the IC package to properly engage with the contact tabs.

2. The electrical connector as claimed in claim 1, wherein the main body of each contact is elongate and forms a pair of barbs on opposite lateral edges thereof for engaging with inner surfaces of the corresponding contact receiving slot of the dielectric base.

3. The electrical connector as claimed in claim 1, wherein a second neck is formed between the contact portion and the main body for providing the contact portions with proper resiliency relative to the main body.

4. The electrical connector as claimed in claim 1, wherein a plurality of projections extend from opposite edges of the dielectric base, each projection forming a latching tab, and wherein the slidable dielectric cover forms a plurality of blocks proximate opposite ends of the bottom face corresponding to corresponding projections of the dielectric base, each block defining a passageway exposed to the top face of the dielectric base and a side inner surface of the block for engaging with corresponding latching tab of the dielectric base.

* * * * *